(12) United States Patent
Narwankar et al.

(10) Patent No.: US 6,200,911 B1
(45) Date of Patent: Mar. 13, 2001

(54) METHOD AND APPARATUS FOR MODIFYING THE PROFILE OF NARROW, HIGH-ASPECT-RATIO GAPS USING DIFFERENTIAL PLASMA POWER

(75) Inventors: Pravin Narwankar, Sunnyvale; Sameer Desai, Mountain View; Walter Zygmunt, San Jose; Turgut Sahin, Cupertino; Laxman Murugesh, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/264,990

(22) Filed: Apr. 21, 1998

(51) Int. Cl.$^7$ .................................................. H01L 21/31
(52) U.S. Cl. .................... 438/758; 438/624; 438/424; 438/782; 438/787; 438/788
(58) Field of Search .................................. 438/424, 758, 438/778, 782, 787, 788, 792, 624, 763, 784; 427/573, 579

(56) References Cited

U.S. PATENT DOCUMENTS

| | | | |
|---|---|---|---|
| 4,956,204 | * 9/1990 | Amazawa et al. | 427/248.1 |
| 5,436,172 | 7/1995 | Moslehi | 437/8 |
| 5,494,854 | * 2/1996 | Jain | 438/692 |
| 5,531,834 | 7/1996 | Ishizuka et al. | 118/723 |
| 5,626,922 | 5/1997 | Miyanaga et al. | 427/535 |
| 5,661,093 | * 8/1997 | Ravi et al. | 438/763 |
| 5,721,021 | 2/1998 | Tobe et al. | 427/570 |
| 5,804,259 | * 9/1998 | Robles | 427/577 |
| 5,937,323 | * 8/1999 | Orczyk et al. | 438/624 |
| 5,968,610 | * 10/1999 | Lui et al. | 438/788 |

FOREIGN PATENT DOCUMENTS

| | | | |
|---|---|---|---|
| 0 552 491 A1 | 7/1993 | (EP) | H01J/37/32 |
| 819 780 | 1/1998 | (EP) . | |
| 0 822 585 A2 | 2/1998 | (EP) | H01L/21/316 |
| 520 519 | 12/1998 | (EP) . | |

OTHER PUBLICATIONS

P. Weigand et al., "High Density Plasma CVD Oxide Deposition: The Effect of Sputtering on the Film Properties," 1996 Proceedings Thirteenth International VLSI Multilevel Interconnection Conference (VMIC), Conference, Santa Clara, CA Jun. 18–20, 1996, pp. 75–80 (Jun. 1996).

W. Lu et al., "Characterization of High Density Plasma CVD USG Film," Proceedings of the SPIE—The International Society for Optical Engineering, vol. 3214, pp. 94–1–3 (1997).

* cited by examiner

Primary Examiner—Wael Farmy
Assistant Examiner—Maria Guerrero
(74) Attorney, Agent, or Firm—Townsend & Townsend & Crew

(57) ABSTRACT

A method and apparatus for modifying the profile of narrow, high-aspect-ratio gaps on a semiconductor substrate are used to fill the gaps in a void-free manner. Differential heating characteristics of a substrate in a high-density plasma chemical vapor deposition (HDP-CVD) system helps to prevent the gaps from being pinched off before they are filled. The power distribution between coils forming the plasma varies the angular dependence of the sputter etch component of the plasma, and thus may be used to modify the gap profile, independently or in conjunction with differential heating. A heat source may be applied to the backside of a substrate during the concurrent deposition/etch process to further enhance the profile modification characteristics of differential heating.

3 Claims, 14 Drawing Sheets

FIG. 4.

METHOD AND APPARATUS FOR MODIFYING THE PROFILE OF NARROW, HIGH-ASPECT-RATIO GAPS USING DIFFERENTIAL PLASMA POWER

BACKGROUND OF THE INVENTION

The present invention relates to the fabrication of integrated circuits. More particularly, the invention provides a technique, including a method and apparatus, for modifying the profile of high-aspect-ratio trenches on a substrate to fill those trenches with void-free dielectric material.

Semiconductor device geometries continue to decrease in size, providing more devices per fabricated wafer and faster devices. Currently, some devices are being fabricated with less than 0.25 µm spacing between features; in some cases there is as little as 0.18 µm spacing between device features. The space between features often takes the form of a trench.

If the height of the features remains constant, reducing the spacing between features increases the aspect ratio of trenches between the features. The aspect ratio of a trench is the ratio of the height of a trench to the width of a trench. For example, a trench that is 2 µm deep and has a 1 µm gap has an aspect ratio of 2:1. Two examples of such trenches that frequently have high aspect ratios are isolation trenches and the trenches formed by adjacent conductive traces on a substrate. Isolation trenches are formed in a substrate between features, such as transistors, and conductive traces are typically formed by patterning a layer of metal or other conductor.

Material, such as doped or undoped silicon oxide glass, is often deposited in the trenches. The deposited material may serve several purposes, including protecting the substrate or conductive lines from physical or chemical damage, electrically insulating one side of the trench from the other, and providing a surface to build subsequent features on. One way to deposit trench-filling material is by chemical vapor deposition (CVD), where gases react or are decomposed to form a film, or layer, on the substrate.

FIGS. 1(a) through 1(c) illustrate that a void may form as a trench with a narrow gap is filled. In conventional CVD processes the gap may become pinched off as material accumulates on the upper edges of the trench as the trench fills. This forms an overhang 4 that may eventually merge, leaving behind a void 5 in the deposited material. Such a void may cause yield or reliability problems.

One method for keeping a gap open so that a trench may be filled is to use a plasma process that sputter etches some of the deposited material away as a layer is being formed. Using a plasma etch during deposition keeps gaps open because the rate of plasma sputter etching is dependant on the surface angle of the material being etched, and is higher at the corners of the trenches.

FIG. 2 shows that the rate of etching 6 in a plasma sputtering system varies as the surface angle, or angle from the horizontal plane of the substrate. In the example shown in FIG. 2, the maximum etching rate 7 occurs at 45 degrees to the horizontal, which represents the etching rate at a corner, or edge, of a trench. FIG. 2 shows that the etching rate at a corner of a trench is about 4 times greater than at a horizontal surface (also known as the "field") for the conditions represented in FIG. 2. The difference between the angular etching rate and the deposition rate 8 in a deposition/etch process allows formation of a facet 9, rather than an overhang, at the edge of a trench, as shown in FIG. 3. It is generally desired, after an initial thin layer of material has been deposited, that the etching rate equal the deposition rate at the trench corners, resulting in no net deposition or etching in this region. Balancing the rate of deposition with the rate of etching should keep the trench open without exposing the underlying corner.

Simply filling a trench by plasma etching during a deposition process appears to be an attractive way to fill a narrow, high-aspect ratio trench in a void-free manner; however, the solution is not that simple. First, etching a layer as it is being deposited reduces the net deposition rate, thus increasing process time and associated cost. Second, the difference between keeping the gaps open and etching into the material forming the edge of the trench can be slight. Etching into the material forming the edge of the trench is undesirable because it erodes the edge, which can affect device performance and because it can contaminate the processing chamber and substrate. Sealing, or lining, the edge of the narrowly spaced gaps so that the trench edge won't be exposed by the plasma etching is difficult and tricky. Only a very thin lining layer can be deposited before the gap starts pinching shut. A thin lining layer does not provide much margin for error when etching to keep the trench open. It is especially difficult to uniformly process large wafers because it is generally more difficult to maintain the required process control over a larger area.

It is typical for a process to have some variation, or "run-out," across the surface of the wafer, and it is challenging to fill narrow trenches in a gap-free manner as the size of typical wafers continues to increase. The combined effects of shrinking device geometries and increasing wafer size makes it even more important to understand the gap-filling process so that additional process controls may be applied. Conventional deposition methods have not addressed the subtle nature of some parameters that affect the gap-filling process. Thus, it is desirable to provide a deposition process with greater control over the process parameters to fill narrow gaps in an efficient, void-free manner.

SUMMARY OF THE INVENTION

The present invention recognizes that it is possible to modify the profile of a trench during a deposition process to fill that trench in a gap fill manner. The trench profile modification can lower the aspect ratio of the trench, thus making it easier to efficiently fill the trench in a gap-free manner. The trench may be etched into a silicon substrate, such as the type of trench used for shallow-trench isolation (STI), may be formed by a patterned metallization layer, or may be another type of trench.

The trench profile is modified during a deposition process in a high-density plasma CVD (HDP-CVD) system. The HDP-CVD system was modified in various ways to provide additional control over the deposition process, particularly with respect to how the plasma heats a substrate. It was determined that the profile of a trench may be modified by the heating the backside of the substrate, by controlling the thermal coupling between the substrate and a supporting structure, by altering the configuration of the plasma, or by a combination of these methods. These methods and combinations of methods provides degrees of process control that allow the efficient deposition of void-free material in narrow gaps.

In a specific embodiment, the backside of a substrate is heated during the deposition process while the front side of the substrate is heated by the plasma formed in the HDP-CVD system chamber. Heating the backside of the substrate changes the temperature profile of the wafer, resulting in a hotter wafer surface, which alters the deposition characteristics. In another embodiment, the substrate is not chucked to the wafer support structure. By not chucking the substrate, less heat is transferred from the surface of the substrate to the wafer support structure, and the surface of the wafer, which is heated by the plasma, becomes hotter than it would if the substrate were chucked. Thus, not chucking the substrate also alters the deposition characteristics.

In another embodiment, the amount of radio frequency (RF) power provided to a top coil relative to the amount of RF power provided to a side coil is adjusted to control the plasma characteristics. The surface of the substrate is heated by the plasma, so controlling the plasma characteristics may also be used to control the surface temperature of the substrate and hence the deposition characteristics.

These and other embodiments of the present invention, as well as its advantages and features are described in more detail in conjunction with the text below and attached figures.

BRIEF DESCRIPTION OF THE DRAWINGS

FIG. 4 is a simplified diagram of one embodiment of a high density chemical vapor deposition system according to the present invention;

DESCRIPTION OF THE PREFERRED EMBODIMENT

I. Introduction

Figure 1A:
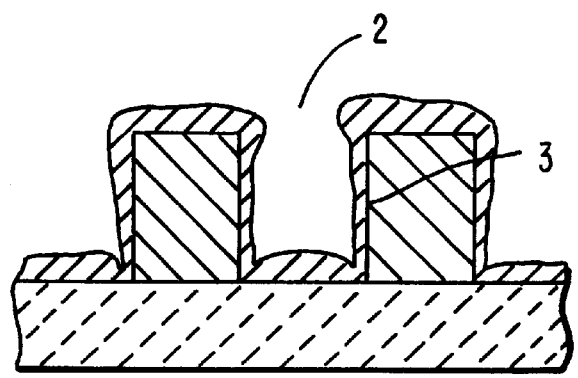
FIG. 1(a)–1(c) are simplified cross-sections of wafers processed according to a deposition process that forms overhangs at the edges of a trench, resulting in a void in the trench.
Figure 1B:
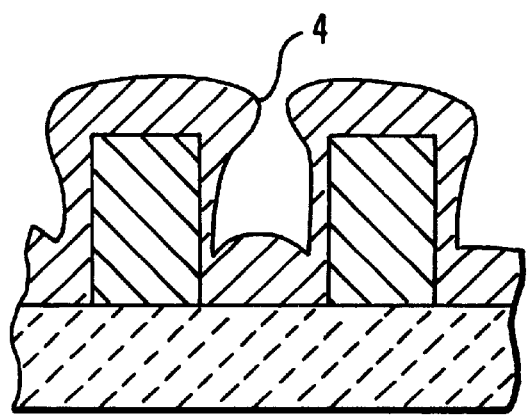
Figure 1C:
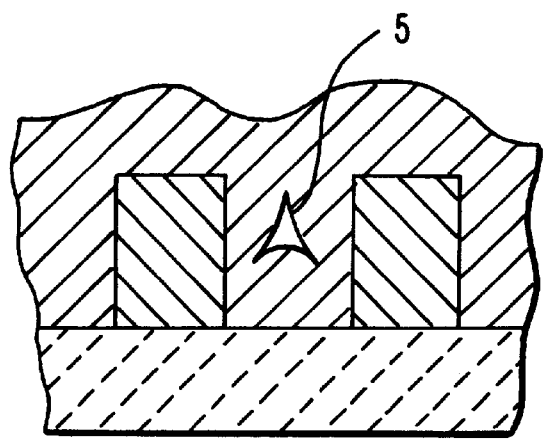
Figure 2:
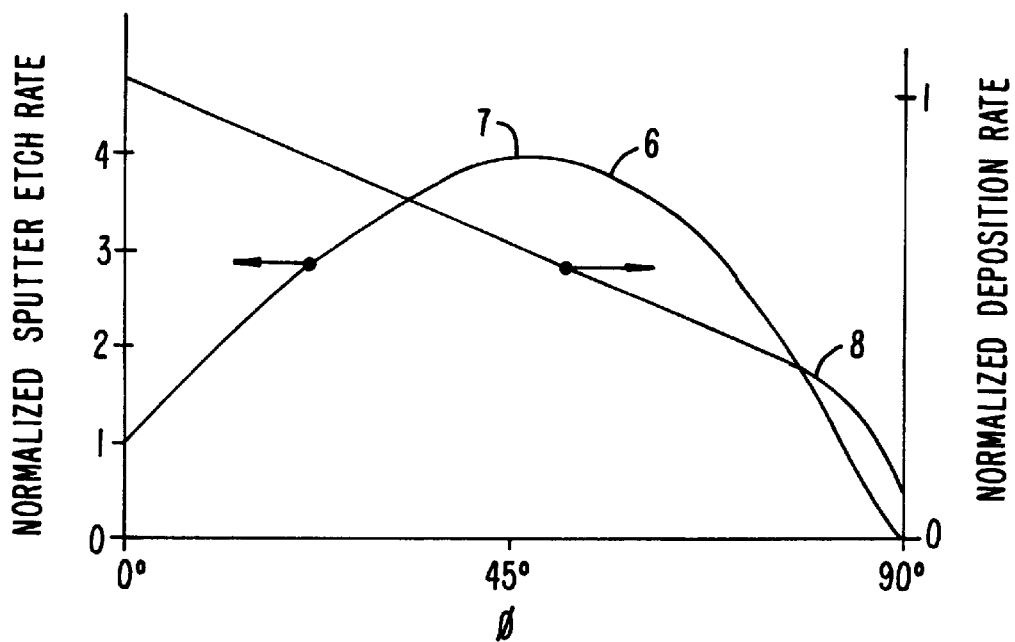
FIG. 2 is a graph representing a normalized sputter rate and a normalized deposition rate versus surface angle.
Figure 3:
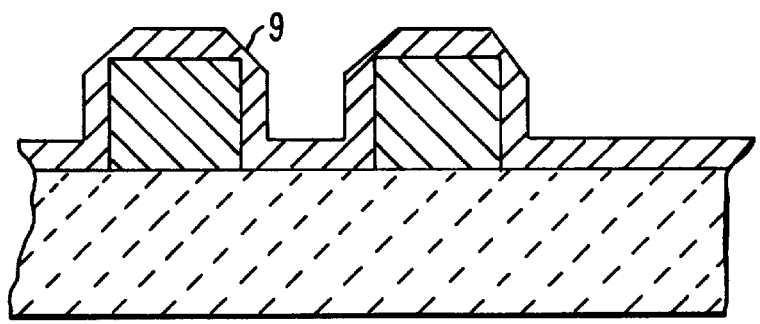
FIG. 3 is a simplified cross-section of a partially filled trench on a substrate with an edge facet formed by concurrent sputtering and deposition.

The present invention allows deposition of material into a trench having an aspect ratio up to at least 5:1 with a gap spacing of 0.25 $\mu$m or less by modifying the trench profile during deposition of the material. The material may be a dielectric material, such as undoped silicon glass (USG), fluorinated silicon glass (FSG), or other glass deposited in an HDP-CVD system. A HDP-CVD system produces a plasma with an ion density approximately two orders of magnitude greater than the ion density of convention capacitively coupled plasma systems. Generally, the geometry of the trench changes as it is being filled. If the gap is kept open while some material is deposited in the bottom of the trench, the aspect ratio of the trench is typically reduced. However, it may also be desirable to control the shape of material in the bottom of the trench and the slope of the sidewall of the trench to avoid forming voids or seams in the material. In particular, the relative net deposition rate on the corner of the trench, compared to the bottom of the trench, may be controlled by adjusting the relative power levels applied by RF power sources to the plasma, which controls the rate of rise of the temperature and the final temperature.

II. An Exemplary CVD System

Figure 4:
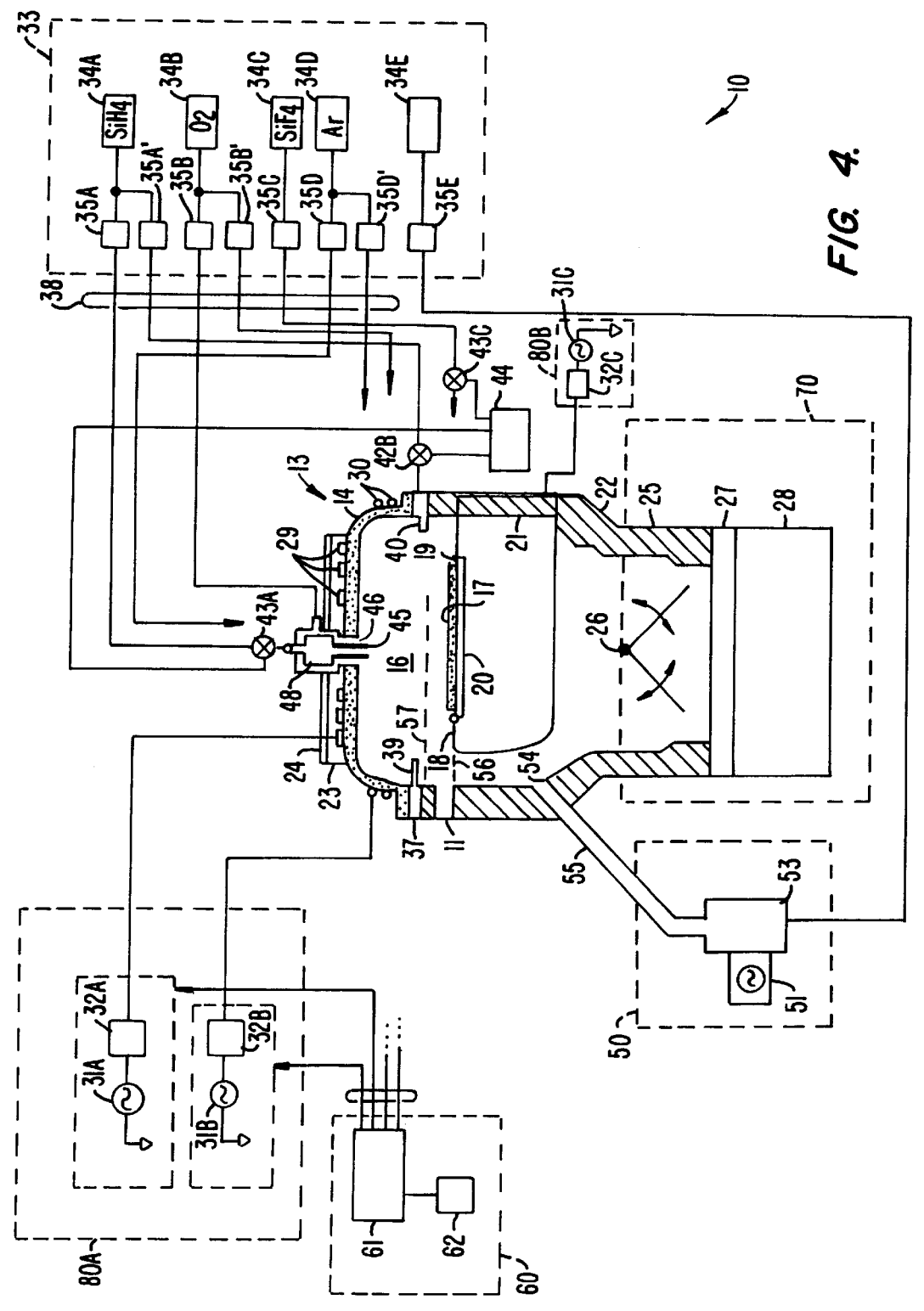

FIG. 4 illustrates one embodiment of an HDP-CVD system 10, in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a dielectric material, such as alumina or aluminum nitride. Dome 14 defines an upper boundary of a plasma processing region 16. Plasma processing region 16 is bounded on the bottom by the upper surface of substrate 17 and the substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening 11 in the side of chamber 13. A motor (not shown) raises and lowers a lift-pin plate (not shown) that raises and lowers lift pins (not shown) that raise and lower the wafer. Upon transfer into chamber 13, substrates are loaded onto the raised lift pins, and then lowered to a substrate receiving portion 19 of substrate support member 18. Substrate receiving portion 19 includes an electrostatic chuck 20 that secures the substrate to substrate support member 18 during substrate processing.

Vacuum system 70 includes throttle body 25, which houses twin-blade throttle valve 26 and is attached to gate valve 27 and turbomolecular pump 28. It should be noted that throttle body 25 offers minimum obstruction to gas flow, and allows symmetric pumping, as described in co-pending, co-assigned United States Patent Application, originally filed on Dec. 12, 1995, and assigned Ser. No. 08/574,839, refiled on Sep. 11, 1996 and assigned Ser. No. 08/712,724 entitled "SYMMETRIC CHAMBER". Gate valve 27 can isolate pump 28 from throttle body 25, and can also control chamber pressure by restricting the exhaust flow capacity when throttle valve 26 is fully open. The arrangement of the throttle valves, gate valve, and turbomolecular pump allow accurate and stable control of chamber pressures from between about 1 to 100 mt.

The source plasma system 80A includes a top coil 29 and side coil 30, mounted on dome 14. A symmetrical ground shield (not shown) reduces electrical coupling between the coils. Top coil 29 is powered by top source RF generator 31A, while side coil 30 is powered by side source RF generator 31B, allowing independent power levels and frequencies of operation for each coil. This dual coil system allows control of the radial ion density in chamber 13, thereby improving plasma uniformity. In a specific embodiment, the top source RF generator 31A provides up to 2,500 W of RF power at nominally 2 MHz and the side source RF generator 31B provides up to 5,000 W of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF generator 31C and a bias matching network 32C. The bias plasma system 80B capacitively couples substrate portion 19 to body member 22, which act as complimentary electrodes. The bias plasma system 80B serves to enhance the transport of plasma species created by the source plasma system 80A to the surface of the substrate. In a specific embodiment, bias RF generator provides up to 5,000 W of RF power at 13.56 MHz.

In addition to the RF fields that are created within process zone 16, a direct current (DC) field may be created within process zone 16. For example, providing a negative DC potential to substrate receiving portion 19 relative to body member 22 may promote the transport of positively charged ions to the surface of substrate 17.

RF generators 31A and 31B include digitally-controlled synthesizers and operate over a frequency range between about 1.7 to about 2.1 MHz. Each generator includes an RF control circuit (not shown) that measures reflected power from the chamber and coil back to the generator, and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 33 provides gases from several sources to the chamber for processing the substrate via gas delivery lines 38 (only some of which are shown). Gases are introduced into chamber 13 through a gas ring 37, a top nozzle 45, and a top vent 46. A cooling gas, such as helium, can be provided to the wafer chuck to thermally couple the wafer to the wafer chuck. FIG. 12C shows the relation of the inner channel 1221 and outer channel 1222 in relation to a substrate 1214 and an electrostatic chuck 1220. The helium pressure in the inner and outer channels may be independently controlled to adjust the relative degree of thermal coupling to the wafer from these regions.

Figure 5:
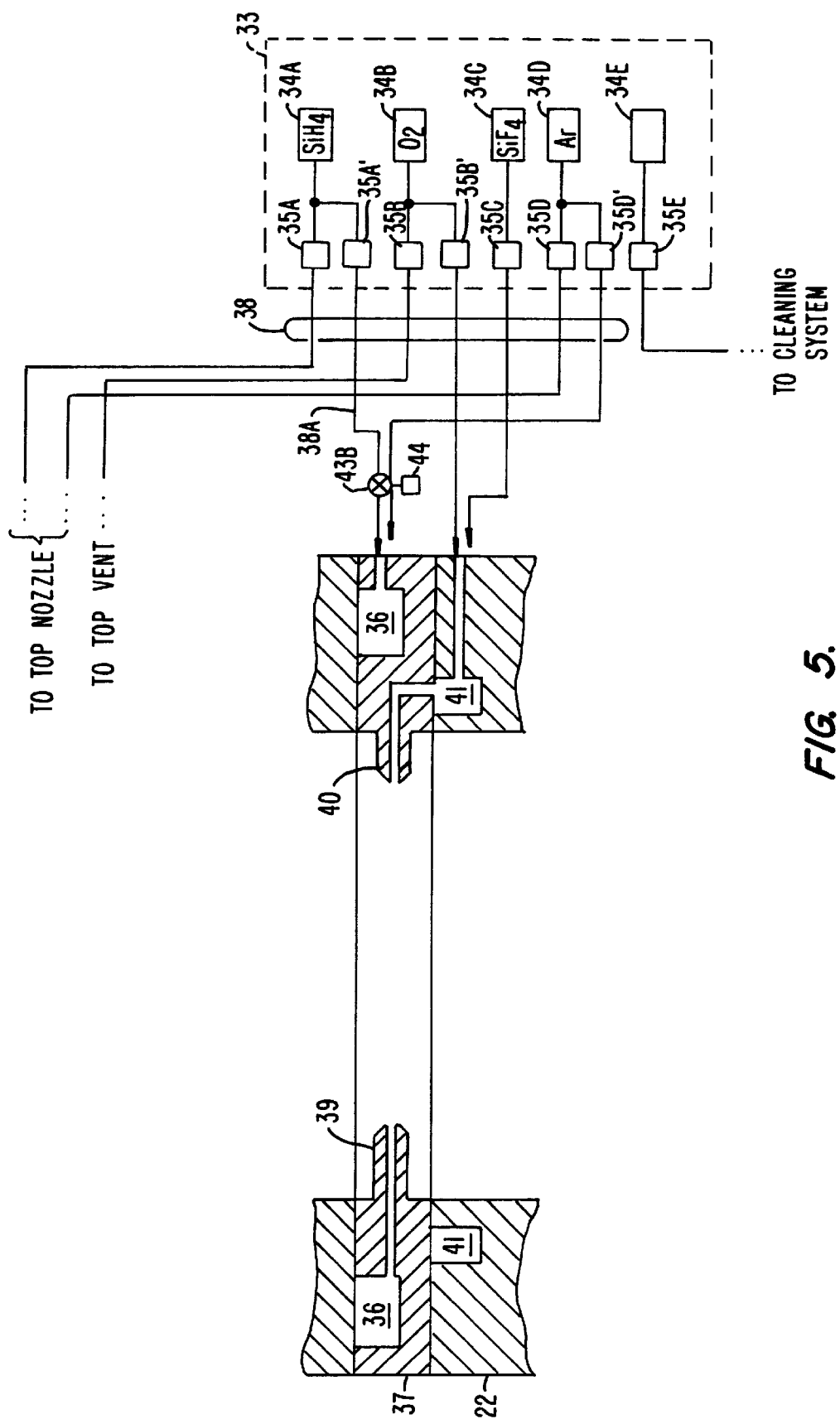
FIG. 5 is a simplified cross-section of a gas ring that may be used in conjunction with the exemplary CVD processing chamber of FIG. 4.

FIG. 5 is a simplified, partial cross-sectional view of chamber 13 showing additional details of gas ring 37. In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 and 40 (only two of which are shown) that provide a uniform flow of gas over the substrate. Nozzle length and nozzle angle may be changed by changing the gas ring 37. This allows tailoring the uniformity profile and gas utilization efficiency for a particular process within an individual chamber. In a specific embodiment, the gas ring 37 has a total of twenty-four gas nozzles, twelve first gas nozzles 40 and twelve second gas nozzles 39.

Gas ring 37 has a plurality of first gas nozzles 40 (only one of which is shown), which in a preferred embodiment are coplanar with, and shorter than, a plurality of second gas nozzles 39. In one embodiment, first gas nozzles 40 receive one or more gases from body plenum 41, and second gas nozzles 39 receive one or more gases from gas ring plenum 36. In some embodiments, it is desirable not to mix gases in the body plenum 41 and the gas ring plenum 36 before injecting the gases into the chamber 13, such as when the first gas nozzles are used to deliver oxidizer gas, such as oxygen or ozone, and the second gas nozzles are used to deliver source gas, such as silane. In other embodiments, process gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In some embodiments, flammable, toxic, or corrosive gases, such as silane or silicon tetrafluoride ($SiF_4$), may be used. In these instances, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 4, other similar valves, such as 43A and 43C, may be incorporated on other gas delivery lines, such as 35A and 35C. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller (MFC) and the chamber or between a gas source and an MFC.

Referring again to FIG. 4, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45 through which gas may flow into the chamber from the gas delivery system. In one embodiment, first gas source 34A is a silane source that supplies source gas nozzles 39 and top nozzle 45. Source nozzle MFC 35A' controls the amount of silane delivered to second gas nozzles 39 and top nozzle MFC 35A controls the amount of silane delivered to top gas nozzle 45. Similarly, two MFCs 35B and 35B ' may be used to control the flow of oxygen to both top vent 46 and first gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E, such as fluorine, silicon tetrafluoride, or equivalents, in reactor cavity 53. The reactive species resulting from this plasma are conveyed to chamber 13 through cleaning gas feed port 54 via applicator tube 55. The materials used to contain the cleaning plasma (e.g. cavity 53 and applicator tube 55) must be resistant to attack by the plasma. The distance between reactor cavity 53 and feed port 54 should be kept as short as practical, as the concentration of desirable plasma species may decline with distance from reactor cavity 53. Generating the cleaning plasma in a remote cavity allows the use of an efficient microwave generator and does not subject chamber components to the temperature, radiation, and bombardment by the glow discharge that may be present in an in situ plasma. Consequently, relatively sensitive components, such as electrostatic chuck 20, do not need to be covered, with a dummy wafer or otherwise protected, as may be required with an in situ plasma cleaning process. During the cleaning process, or other processes, the gate valve 27 may be closed to isolate the turbomolecular vacuum pump 28 from the chamber. In this configuration, the foreline provides a process vacuum generated by remote vacuum pumps, which are typically mechanical vacuum pumps. Isolating the turbomolecular pump from the chamber with the gate valve protects the turbomolecular pump from corrosive compounds or other potentially harmful effects resulting from the chamber clean or other processes.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 31 operates under the control of a computer program stored on the hard disk drive or other computer programs, such as programs stored on a floppy disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 6.

Figure 6:
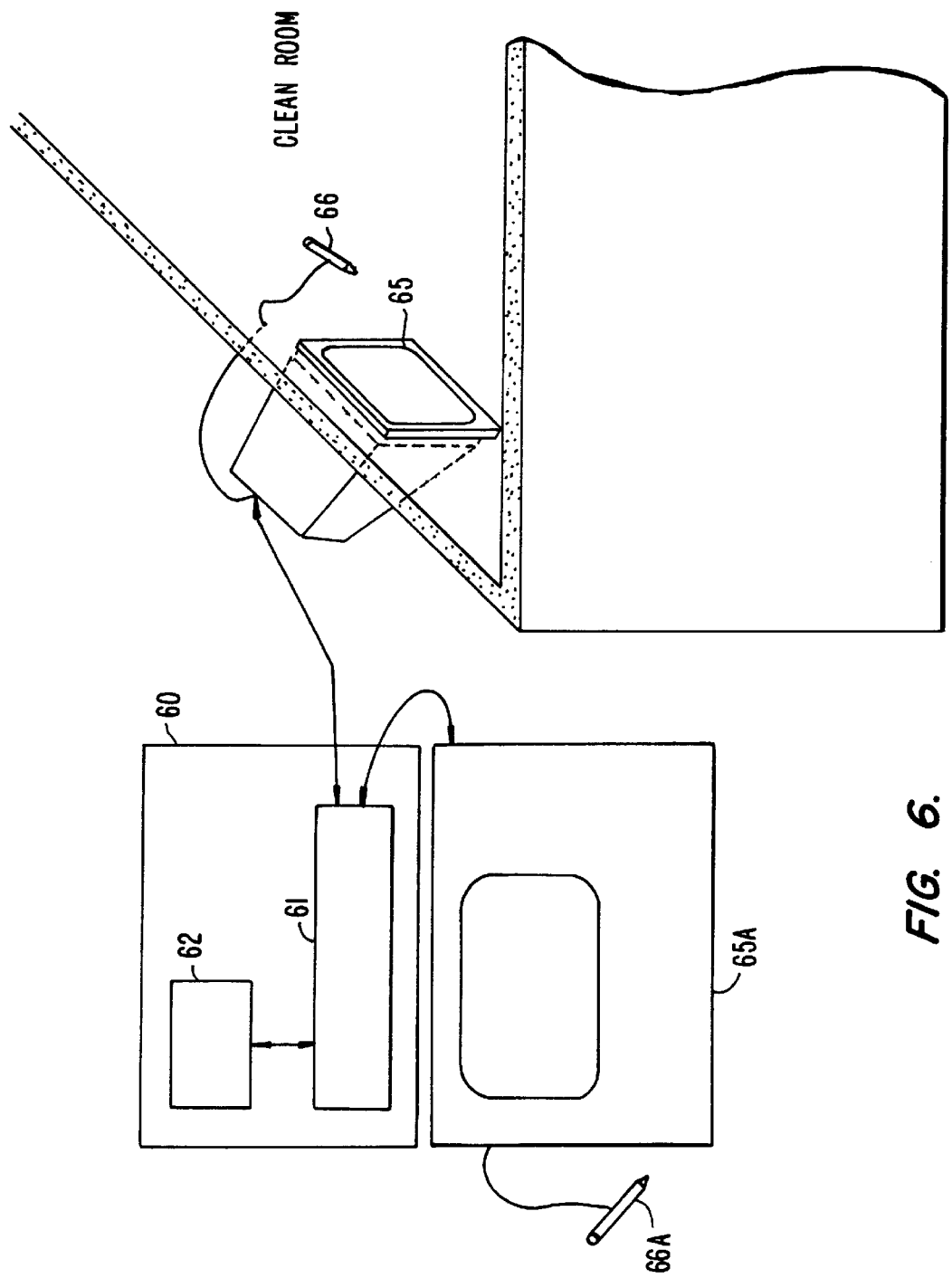
FIG. 6 is a simplified diagram of a monitor and light pen that may be used in conjunction with the exemplary CVD processing chamber of FIG. 4.

FIG. 6 is an illustration of a portion of an exemplary system user interface used in conjunction with the exemplary CVD processing chamber of FIG. 4. System controller 60 includes a processor 61 coupled to a memory 62. Preferably, memory 62 may be a hard disk drive, but of course memory 62 may be other kinds of memory, such as ROM, PROM, and others.

System controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 6. In a preferred embodiment, two monitors, 65 and 65A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 7:
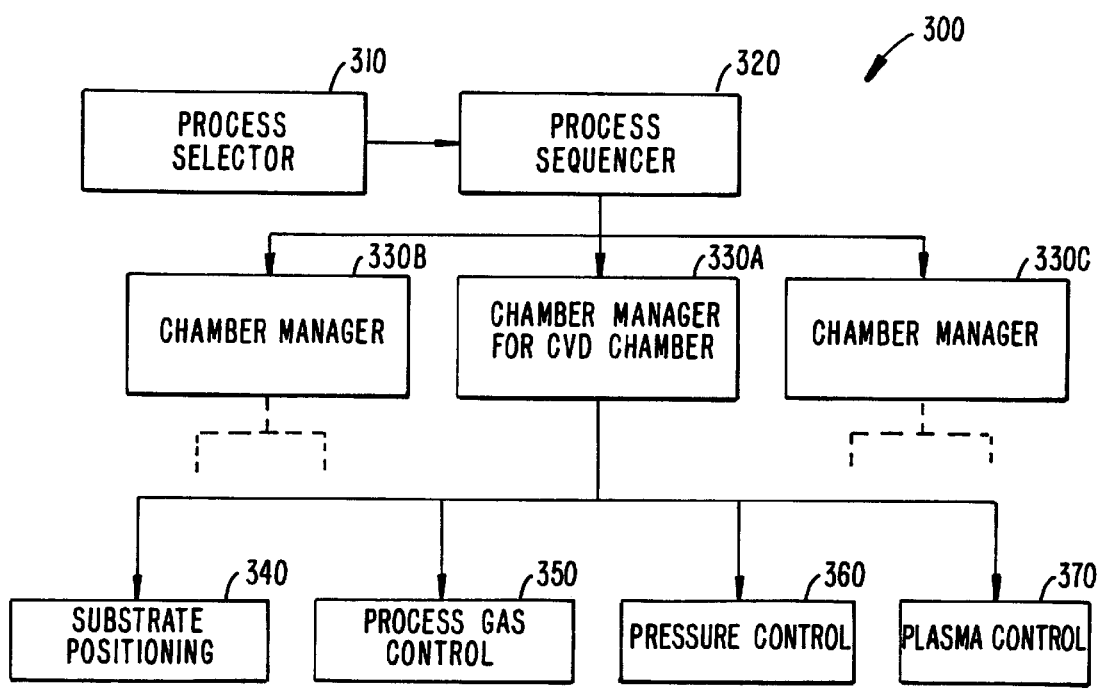
FIG. 7 is a flow chart of an exemplary process control computer program product used to control the exemplary CVD processing chamber of FIG. 4.

FIG. 7 shows an illustrative block diagram of the hierarchical control structure of computer program 300. The computer program may be used with a single chamber, or with multiple chambers, as may be present in a cluster tool arrangement, for example. Alternatively, the computer program may be used to control more than one chamber that is not arranged as a cluster tool. A user enters a process set number and process chamber number into a process selector subroutine 310 in response to menus or screens displayed on the CRT monitor by using the light pen interface. The process sets are predetermined sets of process parameters necessary to carry out specified processes, and are identified by predefined set numbers. Process selector subroutine 310 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller 60, and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers, if present. Multiple users can enter process set numbers and process chamber numbers, or a user can enter multiple process set numbers and process chamber numbers, or a user can enter process numbers for a single chamber. The sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to the process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 7. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multichamber system, after other processing has been completed.

Process gas control subroutine 350 has a program code for controlling process gas composition and flow rates. Subroutine 350 controls the open/close position of the safety shut-off valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber. The above-described steps may then be carried out.

Additionally, when a process gas is to be vaporized from a liquid precursor, for example, tetraethylorthosilane (TEOS), the process gas control subroutine 350 may include steps for bubbling a delivery gas such as helium through the liquid precursor in a bubbler assembly or for introducing the helium to a liquid injection valve. For this type of process, the process gas control subroutine 350 regulates the flow of the delivery gas, the pressure in the bubbler, and the bubbler temperature to obtain the desired process gas flow rates. As discussed above, the desired process gas flow rates are transferred to process gas control subroutine 350 as process parameters.

Furthermore, the process gas control subroutine 350 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 350 may also control the flow of heat-transfer gas, such as helium (He), through inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer for example, and throttle valve 26 position may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 360 is invoked, the desired (or target) pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral, and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B, and for tuning matching networks 32A and 32B. The plasma control subroutine 370 independently sets the RF source power and frequency to the top and the side coils of the RF source plasma system, and also sets the RF bias power level and frequency. The power and frequency to the top coil and the side coil of the RF source plasma system have the capability to be independently set, but could also be set in an interdependent manner. Plasma control subroutine 370, like the previously described chamber component subroutines, is invoked by chamber manager subroutine 330A.

An example of a system which may incorporate some or all of the subsystems and routines described above would be an ULTIMA Systems™, manufactured by Applied Materials of Santa Clara, Calif., configured to practice the present invention.

III. Exemplary Structure

Figure 8A:
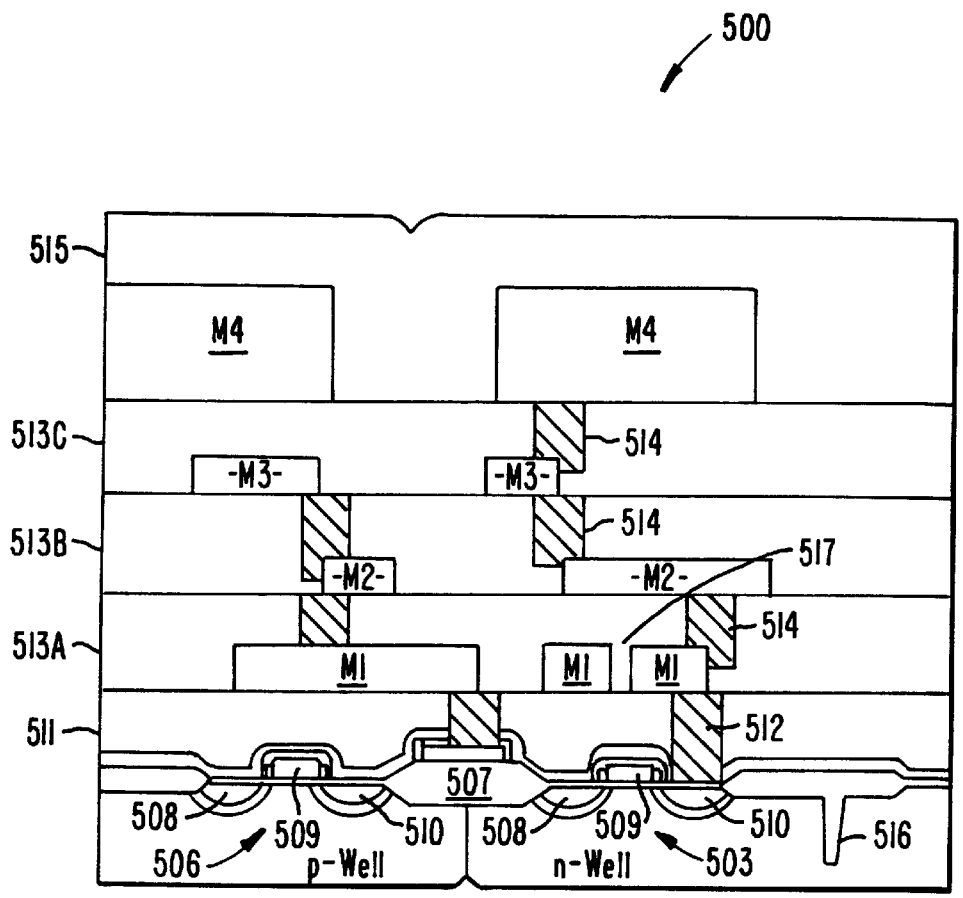
FIG. 8A is a simplified cross-section of part of an integrated circuit produced according to one embodiment of the present invention.

FIG. 8A illustrates a simplified cross-sectional view of an integrated circuit 500 incorporating features of the present invention. Integrated circuit 500 may be fabricated on a semiconductor wafer, such as a silicon wafer, gallium-arsenide wafer, semiconductor-on-insulator wafer, or other wafer. As shown in FIG. 8A, integrated circuit 500 includes NMOS and PMOS transistors 503 and 506, which are separated and electrically isolated from each other by a field oxide region 507. Each transistor 503 and 506 comprises a source region 508, a gate region 509, and a drain region 510.

A premetal dielectric layer 511 separates transistors 503 and 506 from metal layer M1, with connections between metal layer M1 and the transistors made by contacts 512. Metal layer M1 is one of four metal layers, M1–M4, included in integrated circuit 500. Each metal layer M1–M4 is separated from adjacent metal layers by respective inter-metal dielectric (IMD) layers 513A–C. Each IMD layer may be multi-layered of the same or different materials, such as being made from layers of doped and undoped silicon glasses. Adjacent metal layers are connected at selected openings by plugs 514 in vias. Planar passivation layer 515 overlies metal layer M4. The IMD layer 513A fills a trench 517 between adjacent metal traces of the first metal layer M1.

The field oxide region 507 also fills a trench 516. This trench 516 is an STI trench that may separate the n-well device 503 from an adjacent device (not shown). The STI trench 516 if filled with insulating material from the field oxide region and blocks lateral current flow, thus reducing leakage current, latch-up, and other problems.

Embodiments of the present invention are particularly useful for filling narrow, high aspect ratio trenches, such as the trench 517 formed between adjacent metal traces or the STI trench 516 formed in the substrate, but may find uses in each of the dielectric layers shown in integrated circuit 500. It should be understood that the simplified integrated circuit 500 is for illustrative purposes only. One of ordinary skill in the art could implement the present method for fabrication of other integrated circuits, such as microprocessors, application-specific integrated circuits, memory devices, and the like. Additionally, the method of the present invention may be used in the fabrication of integrated circuits using other technologies, such as BiCMOS, NMOS, bipolar, and others.

IV. An Exemplary Deposition Process

Figure 8B:
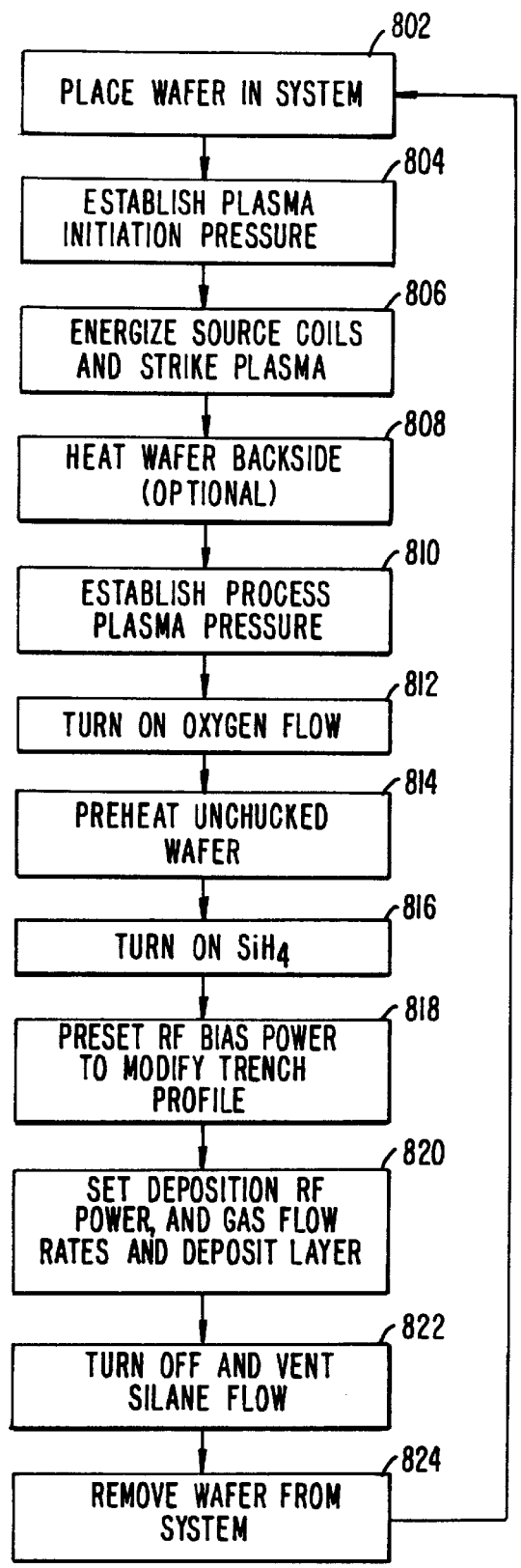
FIG. 8B is a flow chart in accordance with one embodiment of the present invention.

FIG. 8B is a flow chart of an exemplary process according to one embodiment of the present invention. In this process, the temperature of the wafer was controlled by not chucking the wafer to the wafer support structure. This allowed the wafer to thermally "float," resulting in a higher wafer surface temperature as the wafer was heated by the plasma. Although no power was supplied directly to the electrostatic chuck to hold the wafer, the wafer may have been charged by the plasma and this charging may have resulted in some spontaneous chucking to the wafer support structure. Helium gas, which is typically circulated in the inner or outer channels of the wafer chuck to thermally couple the wafer to the chuck, was not circulated in the channels, further enhancing the plasma heating effect. The process filled a narrow, high-aspect ratio trench with undoped silicon glass (USG) on a silicon wafer in an STI application. A similar process could be used to deposit USG between trenches formed by other structures on the wafer, such metal traces, or to deposit other material, such as FSG.

The following process relates to a nominally 200 mm (8-inch) diameter silicon wafer in a deposition chamber with a specific interior volume of about 5 liters; however, those skilled in the art will appreciate that the process could be modified for different substrate materials, different substrate sizes, such as 150 mm and 300 mm wafers, and different chamber volumes, among other variations. The wafer had trenches formed on the wafer prior to this deposition process. The trenches had gaps of typically about 0.25 µms, and aspect ratios of about 5:1 prior to deposition of the layer. The flow rates, RF powers, and other process parameters are chosen according to the dimensions of the trenches that are to be filled, among other factors. The following description of the process is done in conjunction with references to chamber components, as shown in FIG. 4.

A silicon wafer was placed in the deposition system (step 802), and argon, which easily forms a plasma, was admitted at a rate of 95 sccm to the gas nozzles 39 and at a rate of 25 sccm to the top nozzle 45 to establish a chamber pressure (step 804) appropriate for striking a plasma (step 806). About 1,000 W of RF power was applied to the top coil 29 to form a high-density plasma at a chamber pressure of about 50 mT. This plasma pre-heats the wafer prior to deposition. During this step, heat may optionally be applied to the backside of the wafer (step 808) with a heater in the wafer support or with a susceptor that adsorbs heat from the plasma or external heat source, such as a heat lamp, and transfers it to the wafer.

About one second after the plasma has been established, the throttle valve was opened to lower the chamber pressure to between 2–10 mT (step 810) to prepare for the deposition. The initial pressure of about 50 mT is a pressure at which it is easy to initiate a plasma, and once a plasma is started, the pressure may be lowered to the desired process pressure. To achieve the desired pressure, the throttle valve was opened to a set position based on prior characterization of the deposition system, rather than incorporating a pressure feedback loop to set and control the chamber pressure.

Concurrent with setting the chamber pressure to the initial process pressure, the total plasma energy was increased by applying 2,000 W of RF power to the side coil, in addition to the 1,000 W already applied to the top coil. The increase in RF source power probably slightly increased the chamber pressure because forming a plasma from gas creates additional particles.

During the next step the oxygen flow to the chamber was turned on (step 812) at an initial flow of 46 sccm, the argon flow was decreased by 10 sccm, and the throttle valve was opened to a fixed setting so that the chamber pressure would be about 8.5 mT during the following bias preset step. It is generally desirable to start the oxygen flowing before flowing a silicon-containing precursor so that unreacted precursor will not deposit on the chamber walls or process wafer. Approximately 13% of the oxygen flowed into the chamber from the top vent 46, the remainder flowing in through the oxidizer nozzles 40. The substrate was preheated by the plasma for 10 seconds (step 814) before starting the silane flow (step 816) at a rate of approximately 40 sccm, split between the top nozzle 45 and source gas nozzles 39 in similar proportion as the oxygen. The RF source power to the top coil was reduced to 800 W, and the RF source power to the side coil was increased to 3600 W to obtain the desired trench profile modification.

During the bias preset step (step 818) the trench profile was modified by maintaining deposition conditions that were different than the conditions appropriate for the main deposition step. This allowed the aspect ratio of the trench to be reduced prior to the main deposition step, resulting in a rapid and void-free process. Generally, the total RF source power and gas flows were lower in the bias preset step than in the main deposition step. The RF source power applied to the top coil was 900 W and the RF source power to the side coil 29 was 2300 W. The RF bias power was preset to 1500 W. The silane flow was increased to approximately 70 sccm. These conditions were held for 31 seconds to reduce the aspect ratio of the trenches essentially by tapering the sidewall of deposited USG so that the gap was extended above the top of the trench and widened. The sidewall taper also narrowed the spacing between facing sidewalls at the bottom of the trench so that filling the trench during the main deposition process would be less likely to form a void. The trench profile modification is described in flier detail below in section V, and the accompanying FIGS. 9A–9D.

The majority of the layer was deposited during the main deposition step (step 820), which was a concurrent deposition/etch process. The tapered, or V-shaped, trenches were efficiently filled without forming an overhang and subsequent void in the trench. During this step, the RF bias power matching control circuit was turned off, leaving the matching networks in their most recent configurations. This provides a stable RF control system, as the load is not expected to vary much during this step. During the main deposition step, 1300 W of power was supplied to top coil 29, and 3100 W of power was supplied to the side coil, and 3000 W of RF bias power was applied. The throttle valve 26 was controlled to maintain a chamber pressure of 6 mT, while the argon flow to source nozzles 39 was decreased to 46 sccm and the argon flow through top nozzle 45 was decreased to 9 sccm. The main deposition step continued for approximately 70 seconds.

After the desired thickness of silicon glass had been deposited, the flow of silane was turned off and the silane delivery lines were dumped to foreline vacuum 44 through three-way valves (step 822), such as valves 43A–C, as shown in FIG. 4. This removes silane from these lines and reduces silane residue from forming in the line. Furthermore, silane is flammable, so it is undesirable to unnecessarily leave silane in the delivery lines. The wafer is then ready for removal from the chamber (step 824).

The exemplary process described above is for illustrative purposes only. Many process parameters relate to the specific chamber the process is intended to be performed in, in this instance a commercially available ULTIMA™ chamber, manufactured by Applied Materials, Inc., of Santa Clara, Calif. Other chambers may have different volumes, exhaust capacities, plasma configurations, wafer chucking systems, etc., which may result in a process with different pressures, gas flow rates, plasma powers, times, or other process parameters. Additionally, different substrates may result in different process parameters. For example, a process intended for a substrate with a different thermal capacity or thermal conductivity may have a longer or shorter preheating step. Furthermore, other gases may be used in the process, such as TEOS or $SiF_4$ as a source of silicon.

V. Trench Profile Modification Using RF Bias Preset Power

FIGS. 9A–9D are line drawings of scanning electron micrographs (SEMs) of substrates with aluminum traces on them. The aluminum traces form trenches, which are partially filled with silicon oxide glass. The line drawings were produced by tracing original SEMs. FIGS. 9A–9D show the effect of increasing the RF bias power during the preset portion of the deposition process on the shape of the silicon oxide in the trench. Specifically, the profile of the trench can be modified by varying the RF bias power to taper the sidewalls of the trench, thus reducing the aspect ratio of the trench and making the trench easier to fill in a void-free manner.

Referring again to FIG. 4, the RF bias power moves ions within the plasma up and down in relation to the surface of the wafer. It is believed that the wafer support structure acts as one plate of a capacitive coupling structure, while the conductive plasma above the substrate provides the complimentary electrode. Increasing the RF bias power generally increases the sputter rate on a horizontal surface, and hence decreases the net deposition rate, in a simultaneous deposition/etch process.

Etching rate is typically characterized on a horizontal surface of a particular material, such as thermally grown silicon dioxide, in absolute terms, such as angstroms per minute (Å/min.) of material removed. The absolute etching rate on a horizontal surface of a substrate depends on several factors. The temperature of the substrate is one factor that may affect the absolute etching rate because a higher temperature may prevent sputtered material from re-depositing on the substrate. The composition of the process gas, and hence the resulting plasma, may also affect the etching rate. One way the process gas may affect the etching rate is that different sputtering gases may have different etching efficiencies for a given material. Another way the composition of the process gas may affect the etching rate is that the process gas may include an etchant species, such as fluorine or other halogen, that chemically reacts with the deposited layer to remove a portion of that layer. The absolute etching rate also depends on the plasma density and the plasma bias.

The plasma density relates to the number of plasma species per unit volume of plasma, which is believed to be primarily a function of the RF source power. A higher plasma density, within limits, provides more plasma species for etching. The RF bias power creates an electric field orthogonal to a surface of the substrate that can accelerate plasma ions into and away from the surface of the substrate. The ions sputter etch the surface of the substrate by physically bombarding the surface. The etch rate of a surface was found to be more sensitive to changes in the RF bias power than to changes in the RF source power. For example, a 10% change in the RF bias power level changed the sputter etch rate about 10%, when increasing or decreasing the RF bias power. A 10% change in the RF source power level changed the sputter etch rate less than about 5%. The sputter etch rate was measured on a horizontal wafer surface.

Figure 9A:
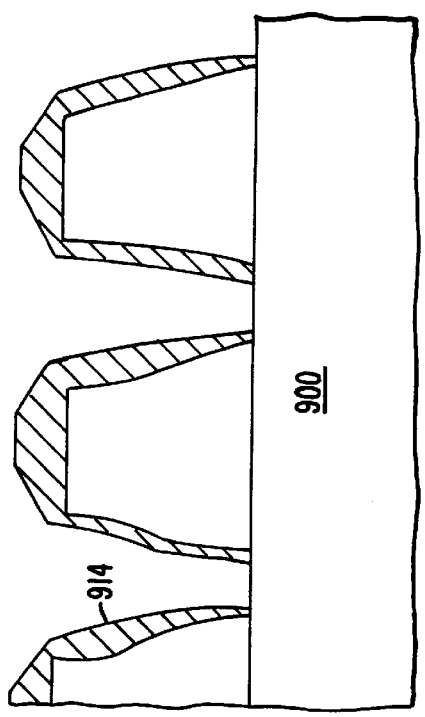
FIGS. 9A–9D are simplified line drawings of scanning electron micrographs (SEMS) of cross sections of wafers with partially filled trenches at various levels of radio-frequency bias power.

FIG. 9A is a line drawing of an SEM taken of a cross section of a substrate 900 with conductive traces 902A, 902B on the substrate. Adjacent conductive traces form a trench 904 between them. The substrate 900 is a 6-inch silicon wafer, and the conductive traces 902A, 902B are aluminum lines approximately 1 μm high. The gap between the aluminum traces is about 0.35 μms wide. It is understood that other substrates, such as a gallium-arsenide substrate, could be used, the substrate could be a different size, such as 8 inches or 12 inches in diameter, and that the trenches could be different heights or widths, or formed by other means, such as etching into the substrate.

The trench 904 in FIG. 9A has been partially filled with a film, or layer, of silicon oxide glass 906 by a simultaneous HDP-CVD deposition/etch process at a bias preset power of 1000 W. The bias preset power is the power applied by the bias plasma system (see FIG. 4, 80) to the wafer support structure during an initial stage of the deposition/etch process. During the bias preset power step, the bias power is set between 30–50% of the bias power that will be applied during the main deposition step. A bias preset power of 1000 W produces a facet 908 on the corner of the trench and a nearly vertical sidewall 910 on the wall of the trench. The cusp 912 is an artifact of the metal etch step that was used to form the trenches. As a general rule, and keeping other process parameters constant, applying more RF bias power increases the sputter etch rate and causes facets to form because of the angular dependence of sputtering, as discussed above.

Figure 9B:
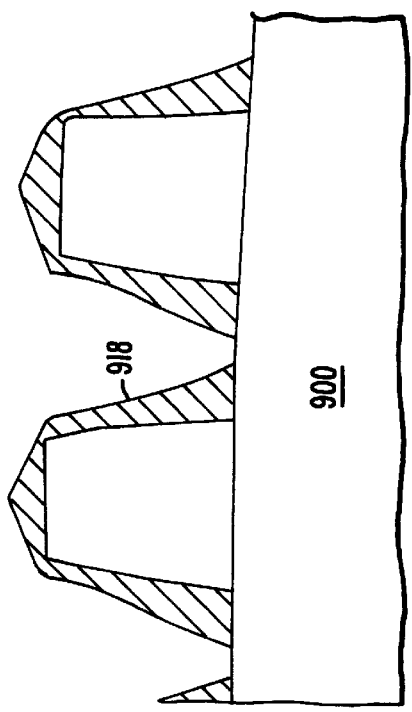
Figure 9C:
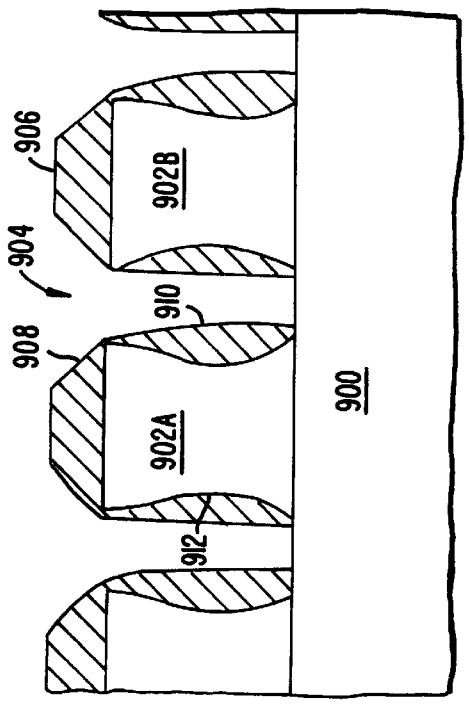
Figure 9D:
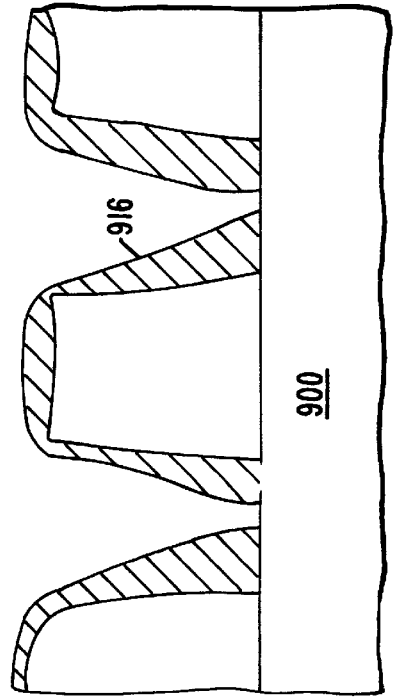

FIG. 9B is line drawing of a SEM of a cross section of a wafer similar to that shown in FIG. 9A except the silicon oxide glass was deposited at an RF bias preset power of 2000 W. The sidewall oxide 914 is less vertical compared to the sidewall oxide 910 of FIG. 9A. FIGS. 9C and 9D are similar line drawings of SEMs in which the bias preset power was 3000 W and 4000 W, respectively. The sidewall oxide 916 in FIG. 9C is less vertical than the sidewall oxide 914, shown in FIG. 9B, and the sidewall oxide 918, shown in FIG. 9D, is the least vertical of all. While it is known that the degree of faceting on the edges of trenches depends on the RF bias power during layer formation, FIGS. 9A–9D show that RF bias power, particularly during the preset step, can also be modulated to change the trench sidewall slope, or profile, as the trenches are filled. This trench profile modification allows gaps to be filled in a gap-free manner by reducing the effective aspect ratio (i.e., the ratio of the height of the trench to the width of the trench).

VI. Trench Profile Modification Using Thermal Coupling Techniques

Figure 10A:
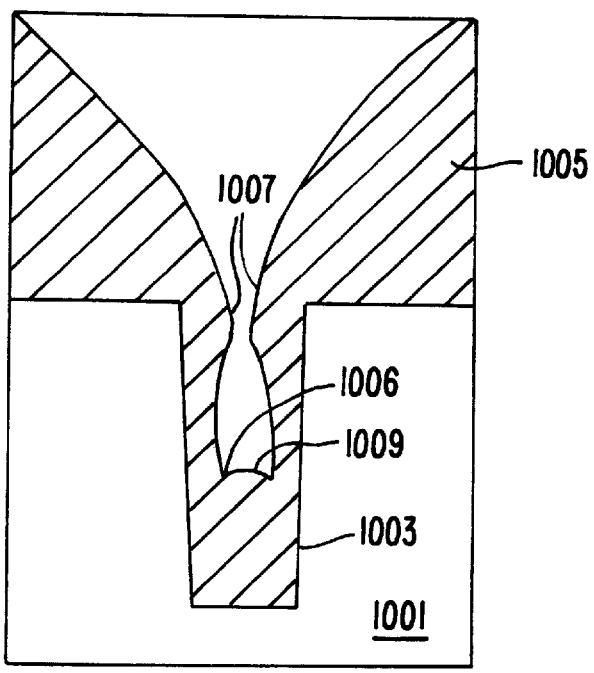
FIG. 10A is a simplified line drawing of a scanning electron micrograph (SEM) of a cross section of a partially filled trench on a substrate that was electrostatically chucked and thermally coupled to the chuck with helium gas.
Figure 10B:
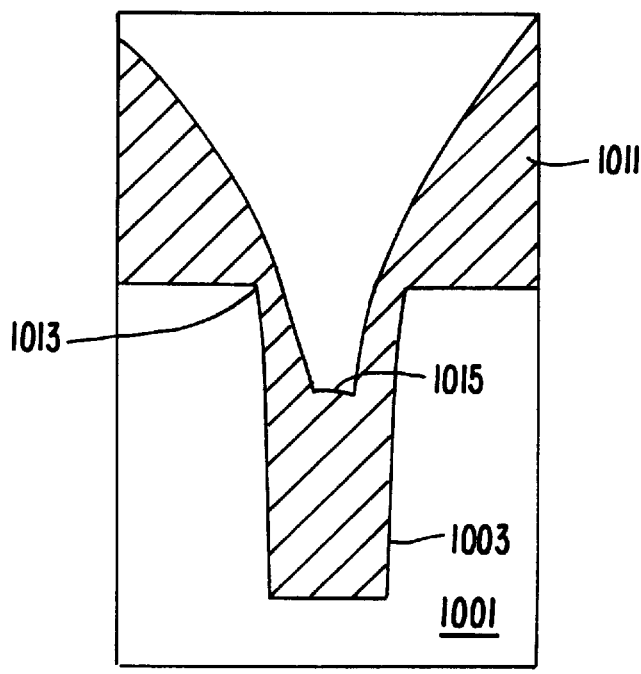
FIG. 10B is a simplified line drawing of a SEM of a cross section of a partially filled trench on a substrate that was not electrostatically chucked.

FIGS. 10A and 10B are line drawings representing SEMs of cross sections of wafers with pre-existing trenches partially filled with a layer of silicon oxide glass. These figures show that the degree of thermal coupling between the backside of a substrate and a heat sink during the formation of a layer of silicon oxide glass can alter the trench profile. The trench sidewall angle, amount of overhang, and trench bottom are all affected by the amount of thermal coupling between the substrate and the substrate holder. It is believed that thermal coupling modifies the trench profile because of the temperature-sensitive nature of the film deposition process.

The degree of thermal coupling appears to affect the localized heating of the substrate. The deposition rate of a silane-based film depends on the substrate temperature. It is believed that at higher temperatures it is more difficult for sputtered material to redeposit on the wafer. Therefore, relatively less deposition occurs on portions of the substrate that are at higher temperatures, such as the edges of trenches, where the plasma can heat the horizontal field and the vertical wall of the material forming the trench.

The substrate in an HDP-CVD system is typically heated by the hot plasma. Generally, the substrate must be hot enough to initiate a reaction from the process gases and plasma to form the desired layer. It is often desirable to limit the temperature of the substrate to avoid damaging preexisting features on the substrate, such as aluminum traces, which may be damaged at temperatures above about 400° C. One way to limit the substrate temperature is to thermally couple the substrate to a heat sink.

One way to thermally couple the substrate to a heat sink is to electrostatically chuck the wafer to a wafer support structure that has a coolant circulating through the support structure. The coolant may be temperature controlled to a constant temperature, such as 65° C., thus maintaining the support structure at about 65° C. and enhancing its performance as a heat sink. Chucking the wafer to the support structure provides some amount of thermal coupling between the support structure and the substrate because the substrate is pulled into intimate contact with the electrostatic chuck, which is integral to the wafer support structure.

Additional thermal coupling between the substrate and the wafer support structure may be provided by circulating a heat transfer gas, such as helium or hydrogen, in channels in the electrostatic chuck that are open to the backside surface of the substrate. The heat transfer gas efficiently transfers heat from the wafer to the electrostatic chuck, which acts as a heat sink. Chucking the substrate to the support structure may by done with or without using a heat transfer gas, thus providing alternative methods of controlling the temperature of the substrate.

Figure 11A:
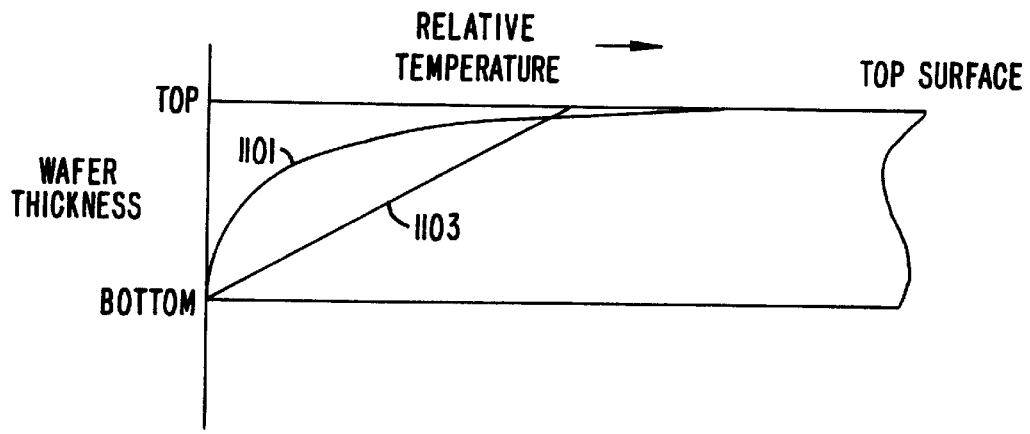
FIG. 11A is a graph showing relative temperature versus wafer thickness for a chucked and an unchucked wafer.

FIG. 11A is a graph showing the relative temperature of chucked and unchucked wafer as the wafer is heated by a plasma in a HDP-CVD chamber. Only the source RF power is applied to the top and side coils of the system, bias RF power was not applied. The upper curve 1101 represents the temperature profile through a silicon wafer a short time after plasma heating was initiated that would be obtained if the wafer was not chucked to the wafer support structure. The lower curve 1103 represents the temperature profile through a silicon wafer a short time after plasma heating was initiated that would be obtained if the wafer were chucked to the wafer support structure. The temperature at the bottom of the wafer is shown as being the same in each instance for reference only, but is reasonably accurate, as the bottom surface temperature of the substrate would equilibrate with the temperature-controlled substrate support. The upper and lower curves 1101, 1103 show that the surface of the substrate achieves a higher temperature when the substrate is not chucked. This means that net deposition rate is less for the unchucked wafer for a short time at the beginning of the deposition.

It is believed that higher temperatures can reduce the relative rate of deposition between the corners and the trench bottom because sputtered material preferentially re-deposits near the corners. Modifying a trench profile using differential temperature may be done as an alternative to, or in addition to, modifying the trench profile using the angular dependence of sputter etching. The trench profile modification achieved by controlling the amount of sputter etching may result in a different profile, and in a different net deposition rate, than the trench profile modification achieved by differential heating. Furthermore, as discussed above, increasing the sputter etch rate may expose the corner of the trench and inject that material into the processing chamber, thus contaminating the chamber and eroding the edge of the trench. Trench profile modification by differential heating does not pose these dangers to the same extent.

Figure 11B:
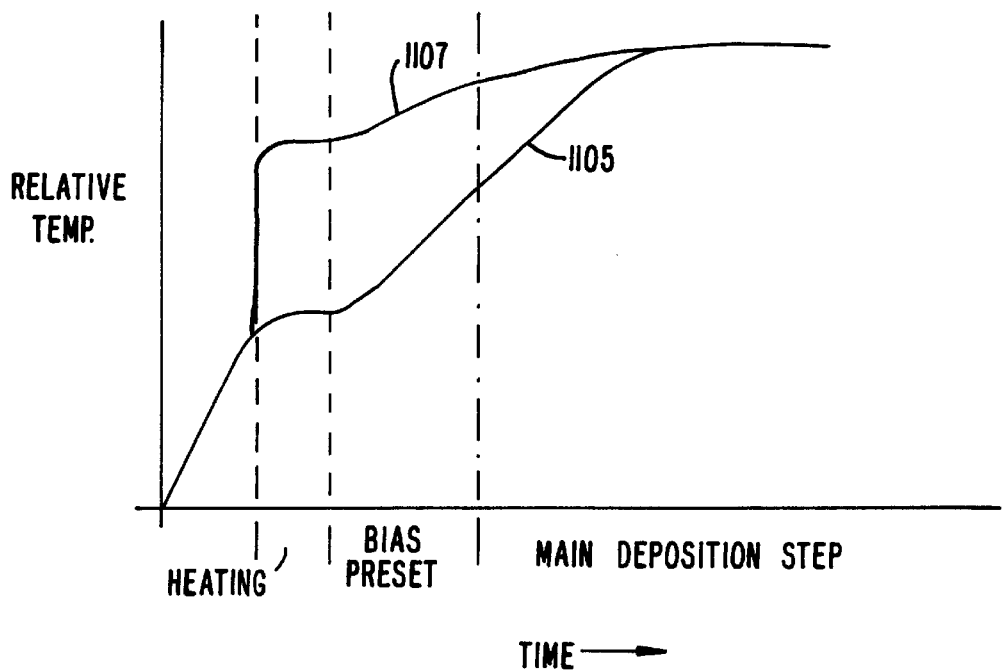
FIG. 11B is a graph showing the relative temperature versus time for a chucked wafer and an unchucked wafer during a portion of an exemplary process sequence.

FIG. 11B is a graph showing the relative temperature of a chucked wafer 1105, and a floating wafer 1107 during an exemplary deposition process sequence. The floating wafer was not chucked to the wafer support structure, and heated up much more rapidly during the heating step of the deposition process sequence. The heating step occurs when a plasma has been struck but no deposition gases have been introduced into the chamber. The temperature of the chucked and unchucked wafers converged during the main deposition step. Thus, trench profile modification of a floating wafer is expected to be greatest during the bias preset step.

Films deposited from silane and similar precursors grow at a greater rate at a lower substrate temperature, provided that the substrate temperature provides sufficient activation energy to the precursor gases. It is believed that a relatively greater amount of the deposited film dissociates back into a gas or plasma phase at higher temperatures, thus decreasing the net deposition rate.

Referring again to FIG. 10A, an 8-inch silicon wafer 1001 with a trench 1003 was processed in an HDP-CVD system to form a layer of silicon oxide glass 1005 using a simultaneous deposition/etch process. Bias power was applied to the wafer support structure and argon gas was included in the process gas mixture to facilitate the etching component of the process. The trench 1003 is typical of a type of trench that may be used to isolate adjacent devices on an integrated circuit, such as by the method commonly known as shallow trench isolation (STI). The wafer 1001 was chucked to an electrostatic chuck that was coupled to a wafer support structure maintained at a temperature of 65° C. The electrostatic chuck has an inner cooling ring and an outer cooling ring that carries a helium heat transfer gas. The helium pressure in the inner ring was 4.5 t and in the outer ring was 9 t. The helium pressure generally corresponds to the thermal transfer capacity of the heat transfer gas, a higher pressure providing more thermal transfer capacity. The electrostatic chuck holds the substrate down with sufficient force so that backside of the substrate forms an adequate seal with the cooling rings to maintain the helium pressure in the cooling rings, which might otherwise escape into the processing chamber, which was at a pressure of about 6.5 mT.

The layer 1005 of silicon oxide glass has formed partial overhangs 1007, or "breadloafs", which eventually would grow together to pinch off the trench gap, leaving a void in the layer. Another potential problem relates to the bottom 1009 of the silicon oxide layer being domed. As the trench is filled, the domed bottom will eventually result in a seam or seams running through silicon oxide layer 1005 when the domed bottom basically pinches off 1006 against the sidewall oxide. These seams may trap impurities introduced in subsequent processing steps or provide conduits for impurities introduced in processing or in use of the circuit.

FIG. 10B is a line drawing of a SEM of a cross section of a wafer 1001 similar to the wafer represented in FIG. 10A (similar trench dimensions), and processed under similar conditions. The wafer shown in FIG. 10B was not chucked to the wafer support structure and thus was not heat sunk to the wafer chuck or wafer support structure, but rather was allowed to thermally "float". This allowed the wafer to achieve a higher temperature, as discussed above in relation to FIGS. 11A and 11B. The silicon oxide glass layer 1011 is thinner over the corner 1013 of the trench 1003 and the bottom 1015 of the layer is not as domed compared to the layer shown in FIG. 10A. The reduced deposition rate on the corner of the trench resulting from the increased substrate temperature modified the trench shape from an original rectangular shape to a desirable "V" shape. This V shape has a lower effective aspect ratio than the original trench shape, making the V-shaped trench easier to fill in a gap-free manner. The lack of an overhang further facilitates filling the trench completely. Additionally, because the bottom 1015 of the trench is essentially flat, the propensity to form a seam is reduced.

The temperature of the unchucked wafer represented in FIG. 10B during the deposition of the silicon oxide layer is estimated to have been about 600° C. at the onset of deposition. This is believed to be about 150–200° C. higher than chucked wafer represented in FIG. 10A. The chamber pressure during the deposition process represented by FIG. 10B was about 4.5 mT. The argon flow rate was decreased from about 110 sccm in the process of FIG. 10A to about 40 sccm to account for the lower chamber pressure. In each instance, the chamber exhaust was fixed, rather than actively controlled with a feedback system. Although one might assume that decreasing the argon pressure would decrease the sputter etch rate by reducing the number of argon ions impinging on the substrate, this is not the case. The sputter etch rate appears flat in the region between about 4.5–6.5 mT when the chamber is set to a fixed exhaust rate. It is believed that the sputter etch rate is essentially constant in this pressure region for a fixed bias RF power level because lowering the pressure reduces the recombination of argon ions into argon atoms, and also increases the mean free path of the argon ions.

An unexpected result of evaluating depositions on unchucked wafers was that the uniformity of the thickness of the deposited layer across the wafer was superior on wafers that were not chucked. This was a surprise because it was thought that a wafer that was chucked and thermally coupled with a heat transfer gas to a temperature-controlled wafer support structure and chuck would have a more uniform temperature and hence a more uniformly deposited layer. In a specific instance, a chucked wafer showed a 2.5% variation in deposited layer thickness across the wafer, while an unchucked wafer processed under otherwise similar conditions showed a variation in thickness of only 0.95%.

VI. Trench Profile Modification Through Wafer Heating

Figure 12A:
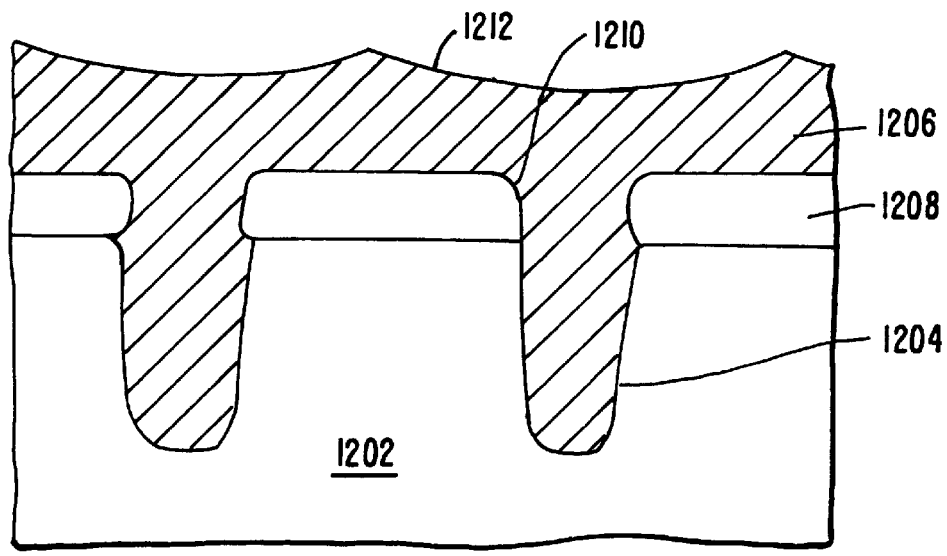
FIG. 12A is a simplified line drawing of a SEM of a cross section of a filled trench on a wafer that was not electrostatically chucked during the deposition process.
Figure 12B:
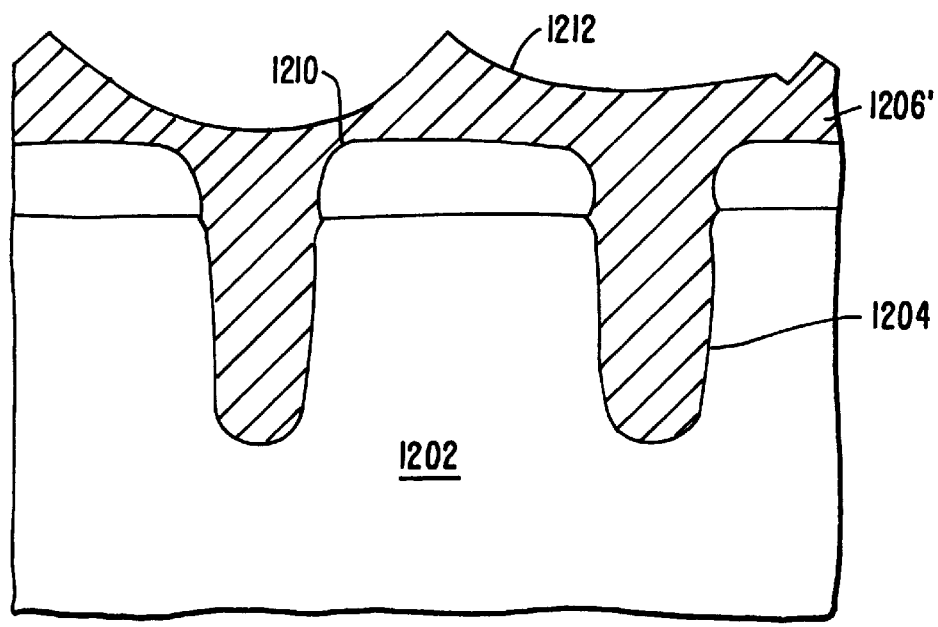
FIG. 12B is a simplified line drawing of a SEM of a cross section of a filled trench on a substrate that was placed on a larger susceptor wafer during the deposition process.
Figure 12C:
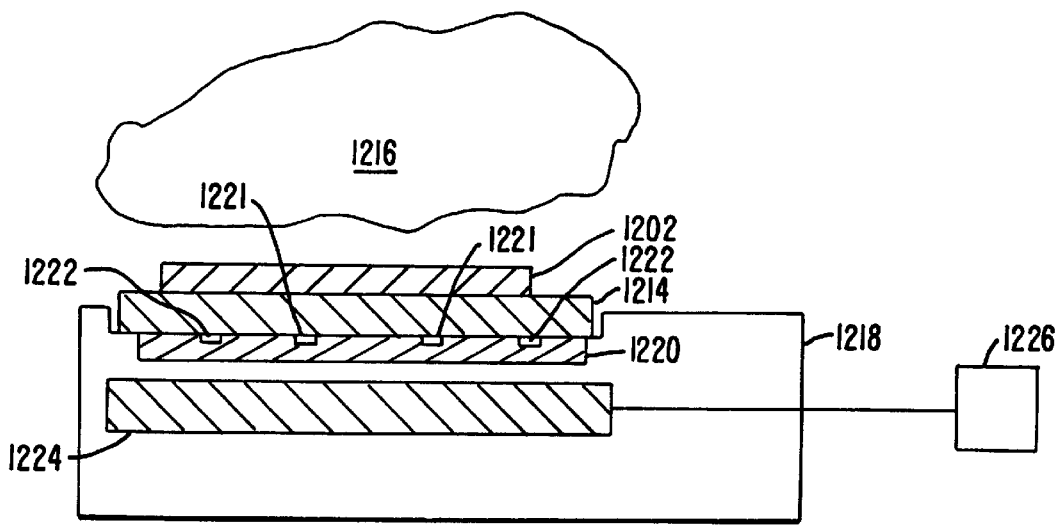
FIG. 12C is a simplified cross section of a wafer on a susceptor.

FIGS. 12A and 12B are line drawing representations of SEMs of cross sections of wafers illustrating how to modify a trench profile by wafer backside heating. FIG. 12A shows a portion of a wafer 1202 with trenches 1204 that have been filled with a layer of silicon oxide glass 1206 in which the wafer was heated by exposure of the wafer to the plasma. A layer 1208 was formed on the wafer 1202 prior to the formation of the trenches 1204. The wafer was an 8-inch wafer and was not chucked to the wafer support structure. The thickness of the silicon oxide glass 1206 over the corner 1210 of the trench 1204 is nearly the same thickness as the thickness of the silicon oxide glass 1206 over the field 1212 of the wafer.

FIG. 12B, in comparison, shows a layer of silicon oxide glass 1206' that was formed on a wafer that was heated by exposure to the plasma, and also by backside heating. The layer of silicon glass 1206' over the corner 1210 of the trench 1204 that is relatively thin compared to the thickness of the silicon oxide glass over the field 1212 of the wafer 1202. In this instance, the process wafer was approximately one half of a 6-inch wafer that was placed on an 8-inch "susceptor" wafer that was chucked to the wafer support structure. The portions of the 8-inch susceptor wafer not covered by the process wafer were exposed to the plasma during processing, absorbed heat from the plasma, and spread the absorbed heat to the backside of the process wafer to modify the trench profile. The process wafer was not chucked to the susceptor wafer, but was thermally floating (i.e. merely lying on the susceptor wafer). It is believed that heating the backside of the process wafer in this manner resulted in a higher front side, or surface, temperature of the process wafer.

As discussed above, a higher temperature results in a lower net deposition rate. As a result, the growth of the silicon oxide glass on the corner of the trench was much less when the process wafer was heated with the susceptor wafer. This shows the viability of keeping narrow gaps open while filling trenches with an HDP-CVD film by heating the backside of the process wafer. Heating the backside of the wafer allows formation of a gap-filling layer in an HDP-CVD process at a higher temperature than would otherwise result in a process without backside heating. Thus, providing backside heating may be used to modify the profile of a trench during deposition of a layer.

Heating the backside of a process wafer provides an alternative to increasing the sputter etch rate during a simultaneous deposition/etch process as a way of keeping narrow gaps open while trenches are being filled. A susceptor structure may be used to absorb heat directly from the plasma to heat the backside of a process wafer, or other methods may be used to heat the backside of the process wafer, including susceptors that built into the wafer support structure and susceptors that receive heat from sources other than the plasma, such as external heat lamps.

FIG. 12C shows a simplified cross section of a susceptor 1214 underneath a wafer 1202 on a substrate support member 1218 in a chamber (not shown, refer to FIG. 4). An area of the susceptor is not covered by the wafer, and may absorb heat from the high-density plasma 1216 that the susceptor may then conduct to the wafer 1202. The susceptor 1214 may be chucked to the wafer support structure 1218 with a chuck 1220. Channels 1222 within the chuck 1220 may carry a heat-transfer gas, such as helium, to improve the thermal coupling between the susceptor 1214 and the wafer support structure 1218. A thermal unit 1224 coupled to a temperature controller and power supply 1226 may heat or cool the wafer support structure 1218, and hence the susceptor 1214.

Backside heating of the process wafer can be accomplished by other means, such as imbedding an electric heater into the electrostatic chuck or heating the chuck with hot oil or other fluid from an external heater. If a heater is incorporated into the wafer support structure of an HDP-CVD system, then it may be desirable to improve the thermal coupling between the wafer and the wafer support structure. Improved thermal coupling may be implemented by providing an electrostatic chuck capable of withstanding the temperature of the wafer support structure or of the wafer, and by providing a heat-transfer gas between the wafer and the wafer support structure.

Figure 12D:
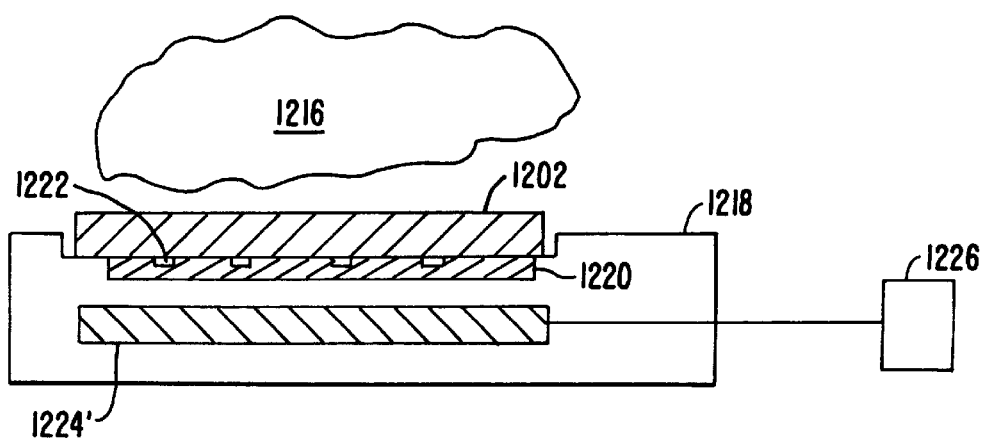
FIG. 12D is a simplified cross section of a wafer support structure for use in an HDP-CVD system.

FIG. 12D shows a simplified cross section of a wafer 1202 on a chuck 1220. A heater 1224' may be used to heat the backside of the wafer 1202 to over 100° C. while the high-density plasma 1216 heats the front side of the wafer.

Wafer heating by energy transfer from the plasma may also be controlled by varying the relative amounts of RF power supplied to the top source coil and the side source coil. As discussed above, the exemplary ULTIMA™ HDP-CVD system produces a plasma from an inductive source coil mounted on the top of the chamber and an inductive source coil mounted on the side of the chamber. The total RF source power is distributed between the top coil and the side coil. The density of the plasma within the chamber is believed to be a function of the total RF source power.

Figure 13:
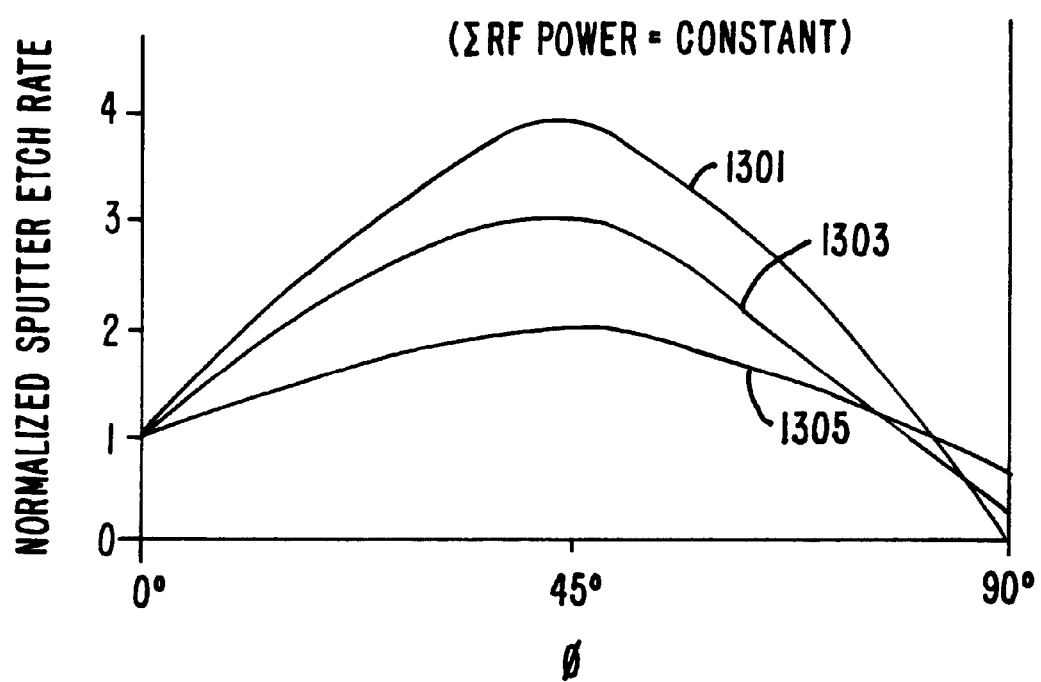
FIG. 13 is a graph of relative temperature of a wafer versus time for a floating substrate on a susceptor wafer and a chucked wafer.

FIG. 13 is a graph of normalized sputter etch rate versus surface angle for several power distributions (the portion of the total RF source power distributed to the side coil) at a constant total source power level. The angular dependence of the sputter etch rate increases with increasing side coil power at a constant total source power. For example, the curve with the greatest variation in sputter etch rate versus surface angle 1301 had a side coil power of 1700 W and a top coil power of 2700 W. The next curve 1303 has a side coil power of 1300 W and a top coil power of 3100 W. The lowest, and flattest, curve had a side coil power of 1000 W and a top coil power of 3400 W. In each case the total RF source power was 4400 W and the sputter rate on a horizontal surface of a test substrate was about 1800 Å/min. FIG. 13 shows that the angular dependence of a sputter etch rate can be controlled by varying the power distribution between the top coil and the side coil to modify a trench profile. For example, by increasing the power distribution to the side coil, it is possible to reduce the sputter etch rate on an edge of a trench relative to the sputter etch rate on the field of the substrate and thus reduce the danger of sputtering into the material defining the trench.

It was originally thought that increasing the power distribution to the side coil would increase the sputter rate at a fixed RF bias power and lower the net deposition rate. However, experiments showed that the sputter rate actually decreased with an increase in the power distribution to the side coil under some conditions. Surprisingly, the deposition rate decreased with an increase in the power distribution to the side coil, even though the sputter rate decreases. In accordance with one aspect of the present invention, it is believed that one may increase the temperature of a process wafer by increasing the power distribution to the side coil of an HDP-CVD reactor. Therefore, trench profiles may be modified by adjusting the power distribution between the side coil and top coil of an HDP-CVD reactor with such coils.

The increase in temperature and the decrease in the angular dependence of sputter etch rate both provide improved gap-filling processes. Furthermore, the combination of these effects are surprisingly beneficial because the heating of the edge of a trench reduces the deposition rate in this localized area, allowing the gap to remain open with less sputter etching. This allows a lower sputter etch rate, thus resulting in a higher net deposition rate. The risks of etching through the deposited layer into the trench-forming material and contaminating the chamber and substrate are also reduced, as discussed above.

Table 1 summarizes experimental results from two similar deposition processes. In each process, the total RF source power was 3,800 W, the RF bias power was 900 W, the chamber pressure was 8.5 mT, and the argon, silane, and oxygen gas flow rates were the same.

TABLE 1

The Effect of Side and Top Coil Power During the Bias Preset Step of an HDP-CVD Deposition Process

| Top Coil Source Power (W) | 1700 | 1300 |
| Side Coil Source Power (W) | 2100 | 2500 |
| Net Deposition Rate (Å/min.) | 6,446 | 6,332 |
| Sputter Etch Rate (Å/min.) | 917 | 806 |

While the above methods of varying the heat of a process wafer in an HDP-CVD chamber have been discussed in relation to holding a gap open while a trench is filled with a silicon oxide glass, these techniques may be applied to other situations. For example, incorporating backside heating or changing the power distribution may be used to control the stoichiometry or chemical bond structure of a deposited layer, such as an FSG layer, by altering the surface temperature of the wafer.

While the above is a complete description of specific embodiments of the present invention, various modifications, variations, and alternatives may be employed. For example more than one technique for modifying a trench profile may be combined with other techniques. Specifically, the RF source power distribution to the side coil may be increased to improve gap filling, and the substrate may be thermally floating to further improve gap filling. An increased level of RF bias power during the RF bias preset step may be used in addition to these two techniques. Furthermore, the formation of many different types of layers may benefit from the techniques herein. For example, fluorinated silicon glass films or other films may fill gaps in a void free manner. It is specifically anticipated that these techniques are not limited to filling gaps, but may be applied to other layer-forming processes where an enhanced substrate surface temperature is desired, such as forming a fluorinated silicon glass layer, where a higher surface temperature can result in better incorporation of the fluorine into the layer. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A method for forming a layer on a substrate in a chamber during an HDP-CVD process, said method comprising steps of:

(a) forming a high-density plasma in the chamber;

(b) flowing a process gas suitable for depositing a layer on a front side of the substrate into the chamber; and (c) heating the front side of the substrate during the HDP-CVD deposition process with the plasma, wherein the substrate is neither thermally coupled nor chucked to a substrate support structure.

2. The method of claim 1 wherein at least one trench with an edge is defined in a field of the substrate.

3. The method of claim 1 wherein the trench has a gap equal to or less than about 0.25 microns and has an aspect ratio equal to or greater than about 5:1 prior to deposition of the layer.

* * * * *